US012610572B2

(12) United States Patent
Minamikawa

(10) Patent No.: US 12,610,572 B2
(45) Date of Patent: Apr. 21, 2026

(54) SEMICONDUCTOR CHIP AND SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Kazuki Minamikawa, Nomi Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 624 days.

(21) Appl. No.: 17/902,246

(22) Filed: Sep. 2, 2022

(65) Prior Publication Data

US 2023/0299186 A1 Sep. 21, 2023

(30) Foreign Application Priority Data

Mar. 21, 2022 (JP) ................................. 2022-044779

(51) Int. Cl.
H10D 62/10 (2025.01)
H01L 23/00 (2006.01)
(Continued)

(52) U.S. Cl.
CPC ........... H10D 12/411 (2025.01); H01L 24/08 (2013.01); H01L 25/072 (2013.01); (Continued)

(58) Field of Classification Search
CPC .... H10D 62/121; H10D 30/024; H10D 30/62; H10D 30/6735; H10D 30/794; (Continued)

(56) References Cited

U.S. PATENT DOCUMENTS 7,009,292 B2 3/2006 Miura et al.
9,947,574 B2 4/2018 Nishikawa et al.
(Continued)

FOREIGN PATENT DOCUMENTS

JP H04-324635 A 11/1992
JP H04-335530 A 11/1992
(Continued)

OTHER PUBLICATIONS

S. Merchant et.al, "Robust 80 V LDMOS and 100 V DECMOS in a Streamlined SOI Technology for Analog Power Applications", Texas Instruments Silicon Department, Proceedings of the 14th International Symposium on Power Semiconductor Devices and ICS, IEEE, Jun. 7, 2002, pp. 185-188.

*Primary Examiner* — Moin M Rahman
(74) *Attorney, Agent, or Firm* — Kim & Stewart LLP

(57) ABSTRACT

A semiconductor chip includes a semiconductor substrate, a plurality of first wirings extending in a first direction parallel to the upper surface of the semiconductor substrate and disposed entirely above the upper surface of the semiconductor substrate, a second wiring disposed between two of the first wirings that are adjacent to each other and entirely below the upper surface of the semiconductor substrate such that an upper surface of the second wiring is below a lower surface of the two first wirings, and a first insulating film provided on the second wiring and spaced apart from the two first wirings in a second direction that is perpendicular to the first direction, the first insulating film having an upper surface that is above the lower surface of the two first wirings.

19 Claims, 5 Drawing Sheets

(51) Int. Cl.

| | | |
|---|---|---|
| *H01L 25/07* | (2006.01) |
| *H10D 12/00* | (2025.01) |
| *H10D 62/13* | (2025.01) |
| *H10D 64/23* | (2025.01) |

(52) U.S. Cl.
CPC ......... *H10D 62/102* (2025.01); *H10D 62/133* (2025.01); *H01L 24/80* (2013.01); *H01L 2224/08245* (2013.01); *H01L 2224/80203* (2013.01); *H01L 2924/13055* (2013.01); *H01L 2924/351* (2013.01); *H10D 64/231* (2025.01)

(58) Field of Classification Search
CPC .. H10D 30/797; H10D 62/115; H10D 62/151; H10D 62/292; H10D 62/822; H10D 64/017; H10D 64/021; H10D 64/257; H10D 64/62; H10D 30/014; H10D 30/0323; H10D 30/43; H10D 30/6744; H10D 30/6757; H10D 64/251; H10D 62/116; H10D 62/364; H10D 84/0165–0195; H10D 84/85–859; H10D 84/907–994; H10D 84/0193; H10D 84/853; H10D 30/60–798; H10D 30/021–0415; H10D 84/83–859; H10D 84/0128; H10D 84/0167; H10D 62/85–854; H10D 30/751; H10D 30/027–0278; H10D 30/63; H10D 84/016; H10D 30/501–509; H10D 84/014; H10D 84/0158; H10D 84/0177; H10D 84/038; H10D 84/834; H10D 86/215; H10D 30/6215; H10D 30/0217; H10D 12/411; H10D 62/102; H10D 62/133; H10D 64/231; H10D 30/665; H10D 30/668; H10D 12/481; H10D 62/8325; H10D 62/8503; H10D 62/127; H10D 62/106; H10D 64/117; H10D 64/518; H01L 21/02532; H01L 21/02603; H01L 21/28568; H01L 21/30604; H01L 25/105; H01L 21/30625; H01L 21/6835; H01L 21/02068; H01L 21/32134; H01L 21/32136; H01L 21/32137; H01L 21/3213; H01L 21/0228; H01L 24/08; H01L 25/072; H01L 24/80; H01L 2224/08245; H01L 2224/80203; H01L 2924/13055; H01L 2924/351; H01L 23/528; H01L 25/07; B81C 2203/0728; B81C 2203/0735; B81C 2203/0742; H10B 63/34

See application file for complete search history.

(56) References Cited

U.S. PATENT DOCUMENTS

| | | | | |
|---|---|---|---|---|
| 2004/0164316 | A1 | 8/2004 | Nakashima | |
| 2006/0255407 | A1 | 11/2006 | Ishida | |
| 2007/0167011 | A1 | 7/2007 | Hidaka | |
| 2009/0174080 | A1* | 7/2009 | Saito | H01L 21/76898 |
| | | | | 257/E23.145 |
| 2014/0018126 | A1* | 1/2014 | Asai | H03H 9/0542 |
| | | | | 455/550.1 |

FOREIGN PATENT DOCUMENTS

| | | | |
|---|---|---|---|
| JP | H08-023094 | A | 1/1996 |
| JP | 2004-259810 | A | 9/2004 |
| JP | 2005-116962 | A | 4/2005 |
| JP | 2006-310508 | A | 11/2006 |
| JP | 2007-184356 | A | 7/2007 |
| JP | 2011-060883 | A | 3/2011 |
| JP | 2011-249438 | A | 12/2011 |
| JP | 2016-171150 | A | 9/2016 |
| WO | 2020144790 | A1 | 7/2020 |

* cited by examiner

SEMICONDUCTOR CHIP AND SEMICONDUCTOR DEVICE

CROSS-REFERENCE TO RELATED APPLICATION(S)

This application is based upon and claims the benefit of priority from Japanese Patent Application No. 2022-044779, filed Mar. 21, 2022, the entire contents of which are incorporated herein by reference.

FIELD

Embodiments described herein relate generally to a semiconductor chip and a semiconductor device.

BACKGROUND

A pressure-welded semiconductor device improves the power density due to double-sided cooling and is highly reliable under high voltage and large current. The pressure-welded semiconductor device includes a plurality of semiconductor chips that are disposed between upper and lower electrode blocks. A pressing force is applied to the upper and lower electrode blocks from the outside to maintain electric contact inside the semiconductor device.

There is a need for a highly reliable semiconductor chip and a highly reliable semiconductor device including the pressure-welded semiconductor device.

DESCRIPTION OF THE DRAWINGS

FIGS. 3A and 3B are schematic cross-sectional views of the semiconductor chip according to the embodiment.

FIG. 4 is a schematic cross-sectional view of a main part of the semiconductor chip according to the embodiment.

DETAILED DESCRIPTION

Figures 1, 2:
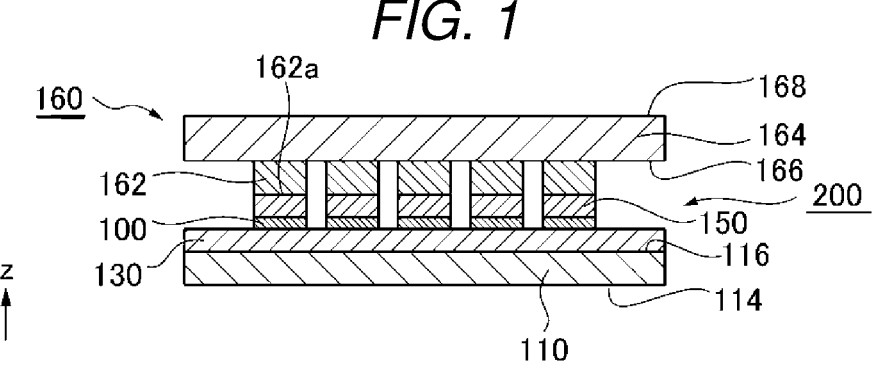
FIG. 1 is a schematic front view of a semiconductor device according to an embodiment.
FIG. 2 is a schematic top view of a semiconductor chip according to the embodiment.

Embodiments provide a semiconductor chip and a semiconductor device that are highly reliable.

In general, according to one embodiment, a semiconductor chip includes a semiconductor substrate, a plurality of first wirings extending in a first direction parallel to the upper surface of the semiconductor substate and disposed entirely above the upper surface of the semiconductor substrate, a second wiring disposed between two of the first wirings that are adjacent to each other and entirely below the upper surface of the semiconductor substrate such that an upper surface of the second wiring is below a lower surface of the two first wirings, and a first insulating film provided on the second wiring and spaced apart from the two first wirings in a second direction that is perpendicular to the first direction, the first insulating film having an upper surface that is above the lower surface of the two first wirings.

Hereinafter, an embodiment will be described with reference to the drawings. In the following description, the same members are given the same reference numerals. A description of member described once is appropriately omitted.

To indicate a positional relationship of parts herein, an upward direction in the drawings is described as "upper", and a downward direction in the drawings is described as "lower". Herein, the terms "upper" and "lower" do not necessarily signify directions with respect to the gravity direction.

A semiconductor device according to the embodiment further includes a first electrode, a first buffer provided on the first electrode, a semiconductor chip provided on the first buffer, a second buffer provided above the first buffer, and a second electrode provided above the second buffer.

FIG. 1 is a schematic front view of a semiconductor device 200 according to the embodiment.

The semiconductor device 200 according to the embodiment is a pressure-welded semiconductor device.

A semiconductor chip 100 is preferably used in the semiconductor device 200. The semiconductor chip 100 may, however, be used in a semiconductor device other than the semiconductor device 200.

The semiconductor device 200 includes a first electrode 110, a first buffer 130, the semiconductor chip 100, a second buffer 150, and a second electrode 160.

An X direction, a Y direction perpendicular to the X direction, and a Z direction perpendicular to the X and Y directions are defined. The X direction is an example of a first direction. The Y direction is an example of a second direction.

The first electrode 110 is, for example, an electrode containing a metal such as copper (Cu). The first electrode 110 is, for example, a plate member. Alternatively, the first electrode 110 may be, for example, a cylindrical member. The first electrode 110 has a first surface 114 and a second surface 116 opposite to the first surface 114. For example, the first surface 114 and the second surface 116 are provided in a plane perpendicular to a Z axis.

The first buffer 130 is provided on the second surface 116. The first buffer 130 is provided in order to relax a thermal stress applied to the semiconductor chip 100 during pressure-welding of the first electrode 110 and the second electrode 160 in the vertical, Z axis, direction. The first buffer 130 contains, for example, a conductive metal such as molybdenum (Mo).

The semiconductor chip 100 is provided on the first buffer 130. For example, the number of the semiconductor chips 100 provided is the same as that of protrusions 162 described below. The semiconductor chip 100 is, for example, an insulated gate bipolar transistor (IGBT). However, the semiconductor chip 100 is not limited to IGBT, and may be a metal oxide semiconductor field effect transistor (MOSFET) or a diode. For example, the semiconductor chip 100 is rectangular in the plane perpendicular to the Z axis or a plane parallel to the second surface 116. However, the shape of the semiconductor chip 100 is not limited to a rectangle in the plane perpendicular to the Z axis.

The second electrode 160 includes the protrusions 162 and a plate 164. The second electrode 160 is, for example, an electrode containing a metal such as copper (Cu). The plate 164 has a third surface 166 and a fourth surface 168 opposite to the third surface 166. The third surface 166 is opposite to the second surface 116. A plurality of protrusions 162 are provided under the plate 164. Each of the protrusions 162 is provided between one of a plurality of semiconductor chips 100 and the third surface 166. The protrusions 162 are connected to the third surface 166.

The number of the protrusions 162 is not limited to the number shown in FIG. 1.

When, for example, the semiconductor chips 100 are rectangular, a surface 162a of each of the protrusions 162 in the plane perpendicular to the Z axis or the plane parallel to the second surface 116 has a rectangular shape that is the same as the shape of the semiconductor chips 100.

The second buffer 150 is provided between each of the semiconductor chips 100 and each of the protrusions 162. The second buffers 150 are provided in order to relax a thermal stress applied to the semiconductor chips 100 when the first electrode 110 and the second electrode 160 are pressure-welded during manufacture of the semiconductor device 200. The second buffers 150 contain, for example, a conductive metal such as molybdenum (Mo). For example, the shape and size of the respective second buffers 150 in the plane perpendicular to the Z axis are the same as the shape and size of the respective semiconductor chips 100 in the plane perpendicular to the Z axis.

In FIG. 1, the shape and size of the first buffer 130 in the plane perpendicular to the Z axis are the same as the shape and size of the second surface 116 of the first electrode 110 in the plane perpendicular to the Z axis. The shape and size of the second buffers 150 in the plane perpendicular to the Z axis are the same as the shape and size of the surfaces 162a of the protrusions 162 in the plane perpendicular to the Z axis. However, the shapes of the first buffer 130 and the second buffers 150 are not limited to the aforementioned shapes.

During manufacture of the semiconductor device 200, the first electrode 110 and the second electrode 160 are pressure-welded in the vertical direction. The first electrode 110 and the second electrode 160 may be pressure-welded by using an electrode block not shown. A resin support not shown may be provided around the semiconductor chips 100, the second buffers 150, and the protrusions 162. A ceramic insulating member not shown may be provided around the semiconductor device 200.

FIG. 2 is a schematic top view of one of the semiconductor chips 100 according to the embodiment. A plurality of emitter wirings 90 are provided separately from each other in the X direction. The emitter wirings 90 are connected to, for example, an emitter electrode of IGBT. A gate pad 94 is provided. The gate pad 94 is connected to, for example, a gate electrode of IGBT. Regions 10a, 10b, 10c, and 10d are depicted in FIG. 2.

Figures 3A, 3B, 4:
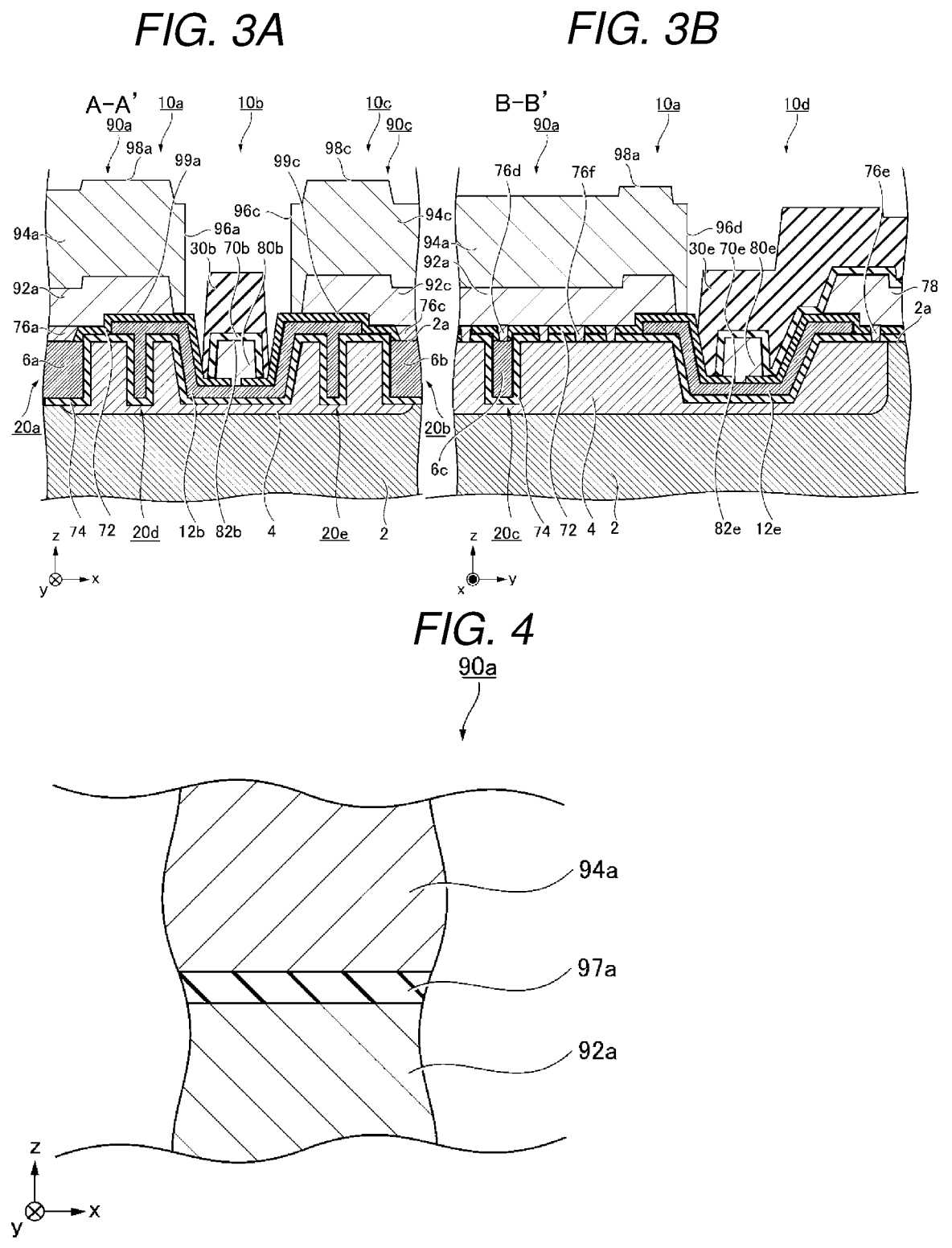

FIGS. 3A and 3B are schematic cross-sectional views of one of the semiconductor chips 100 according to the embodiment. FIG. 3A is the schematic cross-sectional view of one of the semiconductor chips 100 according to the embodiment taken along line A-A' shown in FIG. 2. FIG. 3B is the schematic cross-sectional view of one of the semiconductor chips 100 according to the embodiment taken along line B-B' shown in FIG. 2.

The semiconductor chip 100 according to the embodiment will be described using FIGS. 2, 3A, and 3B.

A semiconductor substrate 2 is, for example, a silicon (Si) substrate containing an n-type impurity. The n-type impurity is, for example, phosphorus (P). However, the semiconductor substrate 2 may be a silicon carbide (SiC) substrate, a gallium arsenide (GaAs) substrate, or a gallium nitride (GaN) substrate. The semiconductor substrate 2 has an upper surface 2a. For example, a drain electrode not shown is provided under the semiconductor substrate 2.

The semiconductor substrate 2 has the region 10a, the region 10b, and the region 10c that are arranged in the X direction in a plane parallel to the upper surface 2a of the semiconductor substrate. The semiconductor substrate 2 has the region 10a and the region 10d that are arranged in the Y direction in the plane parallel to the upper surface 2a of the semiconductor substrate.

A diffusion layer 4 is provided on the upper surface 2a in the semiconductor substrate 2. The diffusion layer 4 contains, for example, a p-type impurity. When the semiconductor substrate 2 is a Si substrate, the p-type impurity is, for example, boron (B). The diffusion layer 4 is provided in order to relax the concentration of electric field at an end of a trench (any of trenches 20a, 20b, 20c, 20d, and 20e) described below.

A trench 20a is provided in the region 10a. The trench 20a extends from the upper surface 2a to the diffusion layer 4.

An electrode 6a is provided in the trench 20a. The electrode 6a contains, for example, a polysilicon containing a p or n conductivity-type impurity. For example, the electrode 6a functions as an emitter electrode of IGBT.

A trench 20b is provided in the region 10c. The trench 20b extends from the upper surface 2a to the diffusion layer 4.

An electrode 6b is provided in the trench 20b. The electrode 6b contains, for example, a polysilicon containing a p or n conductivity-type impurity. For example, the electrode 6b functions as an emitter electrode of IGBT.

A trench 20c is provided in the region 10a. The trench 20c extends from the upper surface 2a to the diffusion layer 4.

An electrode 6c is provided in the trench 20c. The electrode 6c contains, for example, a polysilicon containing a p or n conductivity-type impurity. For example, the electrode 6c functions as an emitter electrode of IGBT.

A trench 20d is provided in the region 10a. The trench 20d is provided between the trenches 20a and 20b. The trench 20d extends from the upper surface 2a to the diffusion layer 4.

A trench 20e is provided in the region 10c. The trench 20e is provided between the trenches 20b and 20d. The trench 20e extends from the upper surface 2a to the diffusion layer 4.

An emitter wiring 90a is provided in the region 10a above the upper surface 2a. The emitter wiring 90a includes, for example, a first portion 92a containing aluminum (Al), and a second portion 94a provided on the first portion 92a and containing Al. The emitter wiring 90a has side surfaces 96a and 96d, an upper surface 98a, and a lower surface 99a. The upper surface 98a of the emitter wiring 90a is pressure-welded to the second buffer 150 (FIG. 1).

An emitter wiring 90c is provided in the region 10c above the upper surface 2a. The emitter wiring 90c includes, for example, a first portion 92c containing aluminum (Al), and a second portion 94c provided on the first portion 92c and containing Al. The emitter wiring 90c has a side surface 96c, an upper surface 98c, and a lower surface 99c. The upper surface 98c of the emitter wiring 90c is pressure-welded to the second buffer 150 (FIG. 1).

A guard ring electrode 78 is provided in the region 10d above the upper surface 2a. The guard ring electrode 78 contains, for example, Al.

A gate wiring 80b is provided in the region 10b below the upper surface 2a. The gate wiring 80b contains, for example, Al. The gate wiring 80b has an upper surface 82b.

A gate wiring 80e is provided in the region 10d below the upper surface 2a. The gate wiring 80e is provided between the emitter wiring 90a and the guard ring electrode 78 when the semiconductor chip 100 is viewed from above. The gate wiring 80e contains, for example, Al. The gate wiring 80e has an upper surface 82e.

The upper surface 82b of the gate wiring 80b is provided at substantially the same height as the upper surface 2a. The lower surface 99a of the emitter wiring 90a and the lower surface 99c of the emitter wiring 90c are provided above the upper surface 2a. The upper surface 82b of the gate wiring is provided below the lower surface 99a of the emitter wiring 90a and the lower surface 99c of the emitter wiring 90c.

The upper surface 82e of the gate wiring 80e is provided at substantially the same height as the upper surface 2a. The upper surface 82e of the gate wiring is provided below the lower surface 99a of the emitter wiring 90a and the lower surface 99c of the emitter wiring 90c.

The gate wirings 80b and 80e are connected to a gate electrode of IGBT.

The gate wirings 80b and 80e are electrically connected to the gate pad 94 (FIG. 2).

The gate wiring 80b is electrically connected to the gate wiring 80e.

A first insulating film 30b is provided in the region 10b above the gate wiring 80b. The first insulating film 30b is provided apart from the emitter wirings 90a and 90c. The first insulating film 30b contains, for example, a polyimide. However, the first insulating film 30b may contain an insulating material other than a polyimide.

A second insulating film 30e is provided in the region 10d above the gate wiring 80e and the guard ring electrode 78. The second insulating film 30e is provided apart from the emitter wiring 90a. The second insulating film 30e contains, for example, a polyimide. However, the second insulating film 30e may contain an insulating material other than a polyimide.

A passivation film 70b is provided between the gate wiring 80b and the first insulating film 30b. For example, the passivation film 70b contains, silicon oxide ($SiO_x$) or silicon nitride (SiN).

A passivation film 70e is provided between the gate wiring 80e and the second insulating film 30e and between the guard ring electrode 78 and the second insulating film 30e. For example, the passivation film 70e contains, silicon oxide ($SiO_x$) or silicon nitride (SiN).

A polysilicon 12b is provided in the trench 20d, between the emitter wiring 90a and the upper surface 2a, between the diffusion layer 4 and the gate wiring 80b, in the trench 20e, and between the emitter wiring 90c and the upper surface 2a. The polysilicon 12b contains, for example, a p or n conductivity-type impurity. For example, the gate wiring 80b is connected to the polysilicon 12b.

A polysilicon 12e is provided between the emitter wiring 90a and the upper surface 2a, between the diffusion layer 4 and the gate wiring 80e, and between the guard ring electrode 78 and the diffusion layer 4. The polysilicon 12e contains, for example, a p or n conductivity-type impurity.

A contact plug 76a is provided between the emitter wiring 90a and the electrode 6a. The contact plug 76a connects the emitter wiring 90a to the electrode 6a. The contact plug 76a contains, for example, tungsten (W).

A contact plug 76c is provided between the emitter wiring 90c and the electrode 6b. The contact plug 76c connects the emitter wiring 90c to the electrode 6b. The contact plug 76c contains, for example, W.

A contact plug 76d is provided between the emitter wiring 90a and the electrode 6c. The contact plug 76d connects the emitter wiring 90a to the electrode 6c. The contact plug 76d contains, for example, W.

A contact plug 76e is provided between the guard ring electrode 78 and the diffusion layer 4. The contact plug 76e connects the guard ring electrode 78 to the diffusion layer 4. The contact plug 76e contains, for example, W.

A contact plug 76f is provided between the emitter wiring 90a and the diffusion layer 4. The contact plug 76f connects the emitter wiring 90a to the diffusion layer 4. The contact plug 76f contains, for example, W.

An oxide layer 74 is provided between the electrode 6a and the semiconductor substrate 2 and between the polysilicon 12b and the diffusion layer 4. The oxide layer 74 is further provided between the electrode 6c and the diffusion layer 4 and between the polysilicon 12e and the diffusion layer 4. The oxide layer 74 is furthermore provided between the guard ring electrode 78 and the semiconductor substrate 2. The oxide layer 74 contains, for example, silicon oxide.

An interlayer film 72 is provided between the electrode 6a and the emitter wiring 90a, between the oxide layer 74 and the emitter wiring 90a, between the polysilicon 12b and the emitter wiring 90a, between the first insulating film 30b and the polysilicon 12b, between the passivation film 70b and the polysilicon 12b, between the gate wiring 80b and the polysilicon 12b, between the electrode 6b and the emitter wiring 90c, between the oxide layer 74 and the emitter wiring 90c, and between the polysilicon 12b and the emitter wiring 90c. The interlayer film 72 is provided between the oxide layer 74 and the emitter wiring 90a, between the polysilicon 12e and the emitter wiring 90a, between the second insulating film 30e and the polysilicon 12e, between the passivation film 70e and the polysilicon 12e, between the gate wiring 80e and the polysilicon 12e, between the guard ring electrode 78 and the polysilicon 12e, and between the guard ring electrode 78 and the oxide layer 74. The interlayer film 72 contains, for example, silicon oxide.

FIG. 4 is a schematic cross-sectional view of a main part of the emitter wiring 90a. An oxide film 97a containing Al is provided between the first portion 92a and the second portion 94a. Such an oxide film 97a is, for example, a natural oxide film containing Al that is formed by natural oxidation of the first portion 92a. An oxide film containing Al is similarly provided between the first portion 92c and the second portion 94c in the emitter wiring 90c. Although the natural oxide film containing Al is provided, the first portion 92a is electrically connected to the second portion 94a. Also, although the natural oxide film containing Al is provided, the first portion 92c is electrically connected to the second portion 94c.

FIGS. 5A to 10B are schematic cross-sectional views of the semiconductor chip according to the embodiment during a process of manufacturing the semiconductor chip.

First, the diffusion layer 4 containing a p-type impurity is formed on the semiconductor substrate 2, for example, by ion implantation. Subsequently, a photoresist P is appropriately formed on the upper surface 2a (FIGS. 5A and 5B).

Figures 5A, 5B, 6A, 6B, 7A, 7B:
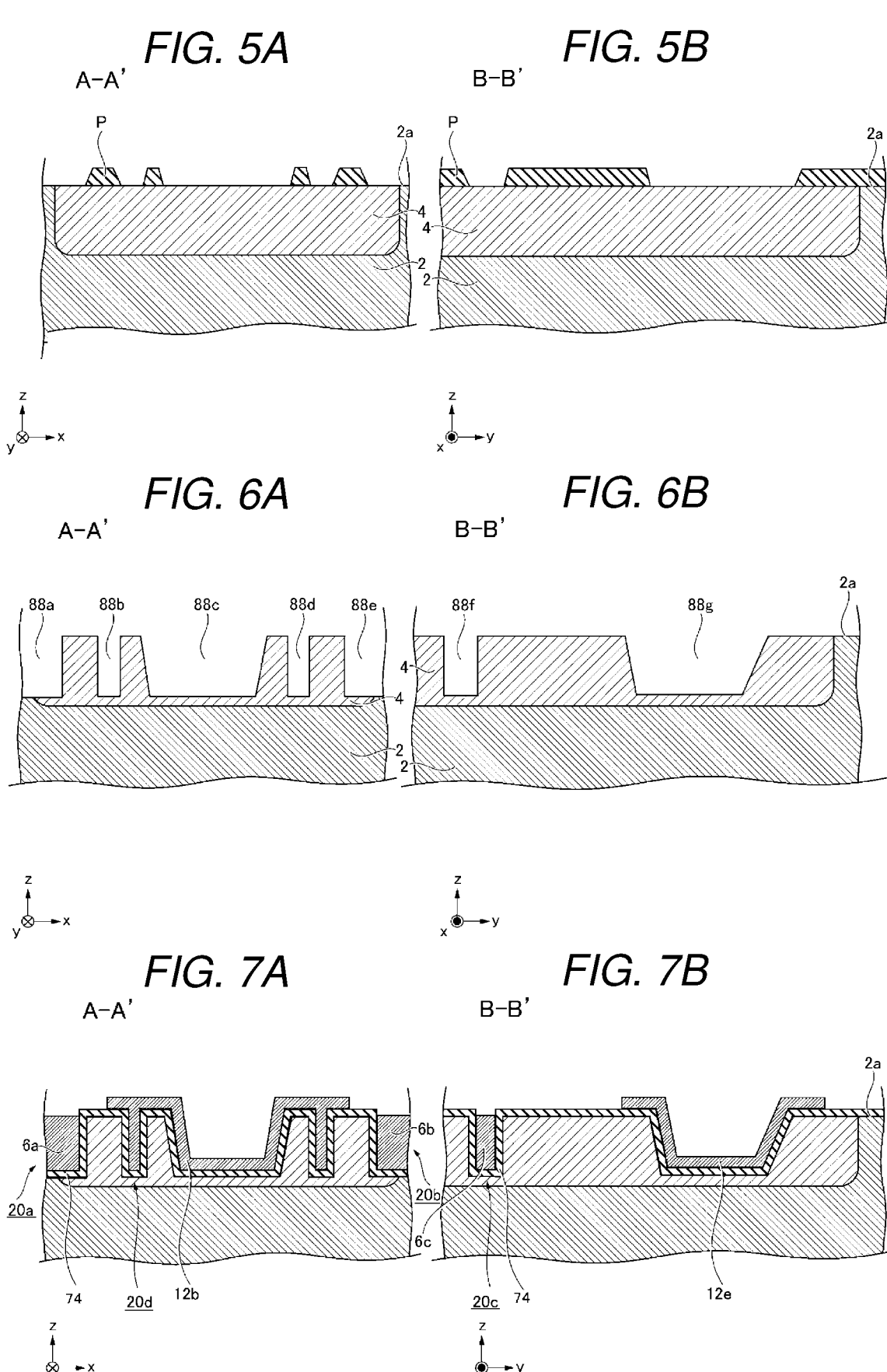
FIGS. 5A, 5B, 6A, 6B, 7A, 7B, 8A, 8B, 9A, and 9B are schematic cross-sectional views of the semiconductor chip according to the embodiment during a process of manufacturing the semiconductor chip.

Grooves 88a to 88g are then formed, for example, by reactive ion etching (RIE) using the photoresist P as a mask (FIGS. 6A and 6B).

The oxide layer 74 is formed in the grooves 88a to 88g, for example, by low pressure chemical vapor deposition (LPCVD). The polysilicon 12b and the polysilicon 12e containing a p or n conductivity-type impurity, and the electrodes 6a and 6c are formed on the oxide layer 74, for example, by CVD (FIGS. 7A and 7B).

Subsequently, after forming the interlayer film 72, holes are formed to penetrate the oxide layer 74 and the interlayer film 72, for example, by photolithography and etching. The contact plugs 76a, 76c, 76d, 76e, and 76f containing W, are formed in the holes, for example, by CVD.

The first portion 92*a* in the emitter wiring 90*a*, the first portion 92*c* in the emitter wiring 90*c*, and the gate wirings 80*b* and 80*e* are then formed, for example, by sputtering. The passivation film 70 is formed on the first portion 92*a* in the emitter wiring 90*a*, the first portion 92*c* in the emitter wiring 90*c*, and the gate wirings 80*b* and 80*e*, for example, by CVD (FIGS. 8A and 8B).

Figures 8A, 8B, 9A, 9B:
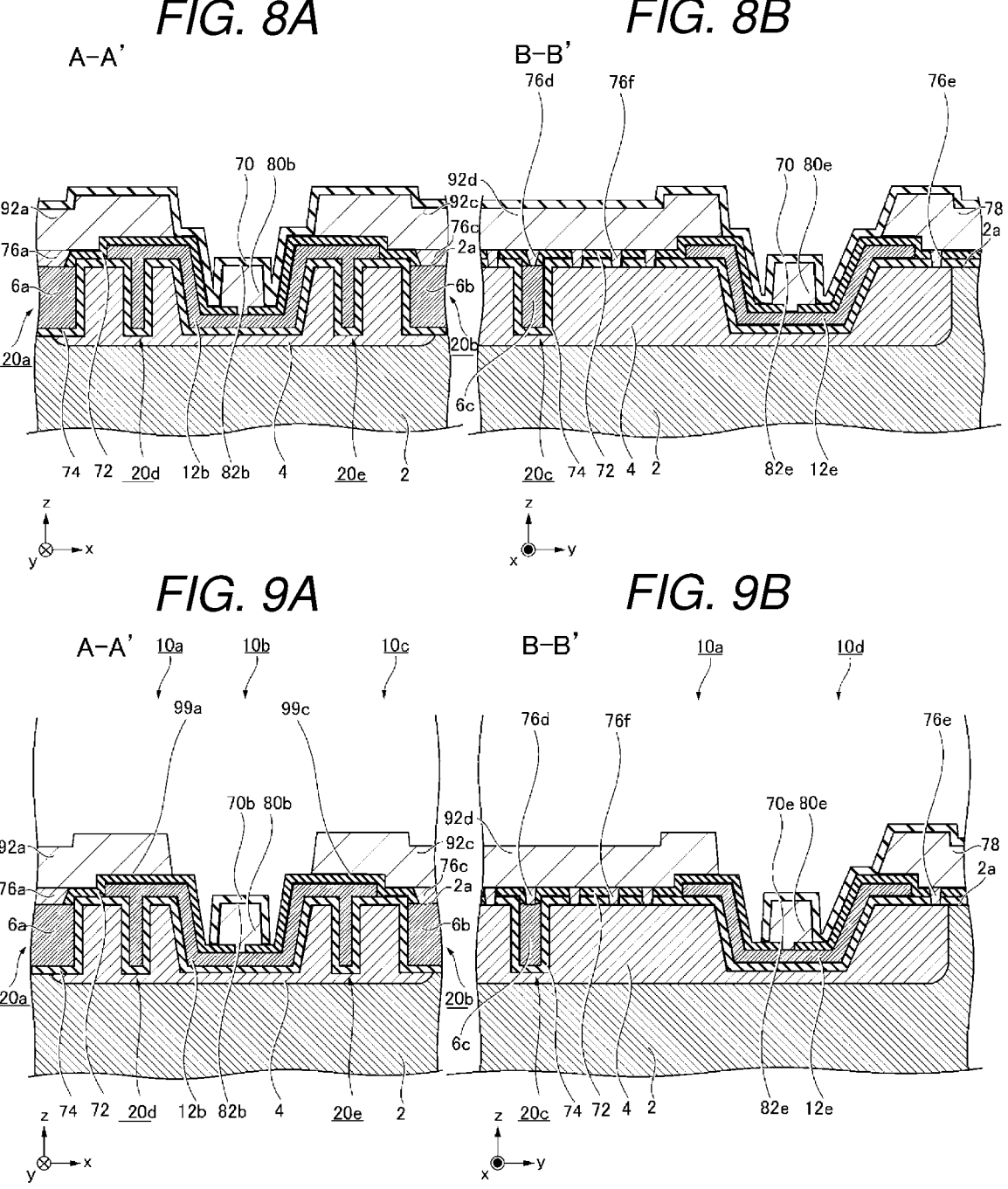

Subsequently, the passivation film 70 is partially removed, for example, by photolithography and RIE (FIGS. 9A and 9B).

The first insulating film 30*b* and the second insulating film 30*e* are formed on the passivation film 70. The second portion 94*a* is then formed on the first portion 92*a* in the emitter wiring 90*a*, for example, by sputtering. The second portion 94*c* is formed on the first portion 92*c* in the emitter wiring 90*c*, for example, by sputtering. As described above, the semiconductor chip 100 according to the embodiment is obtained.

Next, a functional effect of the semiconductor chip according to the embodiment will be described.

Figures 10A, 10B:
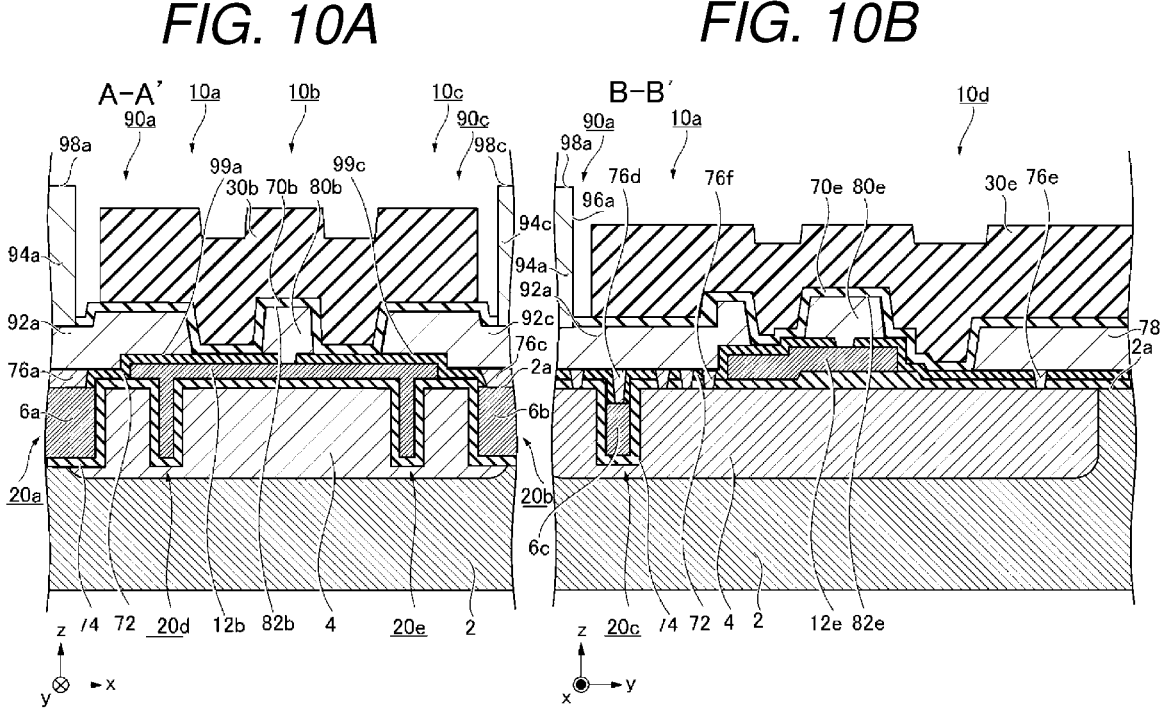
FIGS. 10A and 10B are schematic cross-sectional views of a semiconductor chip of a comparison example.

FIGS. 10A and 10B are schematic cross-sectional views of a semiconductor chip 1000 in a comparison example of the embodiment. The semiconductor chip 1000 includes the gate wirings 80*b* and 80*e* that are provided above the upper surface 2*a* of the semiconductor substrate.

Due to self-heating of the semiconductor chip 1000, the emitter wirings 90*a* and 90*c* may extend in the X direction, break the first insulating film 30*b* and the passivation film 70, and then come into contact with the gate wiring 80*b*.

In particular, when the semiconductor chip 1000 is used in the semiconductor device 200 that is a pressure-welded semiconductor device, the upper surface 98*a* of the emitter wiring 90*a* and the upper surface 98*c* of the emitter wiring 90*c* are pressure-welded to the second buffer 150. Thus, the emitter wirings 90*a* and 90*c* in particular may extend in the X direction.

Similarly, the emitter wiring 90*a* may extend in the Y direction and then come into contact with the gate wiring 80*e*.

The semiconductor chip 100 according to the embodiment includes the semiconductor substrate 2 having the upper surface 2*a* and including the regions 10*a* and 10*b* in the plane parallel to the upper surface 2*a*, the emitter wiring 90*a* provided in the region 10*a* above the upper surface 2*a*, and the gate wiring 80*b* provided in the region 10*b* below the upper surface 2*a* and having the upper surface 82*b* that is lower than the lower surface 99*a*.

Thus, the emitter wirings 90*a* and 90*c* are less likely to come into contact with the gate wiring 80*b* even when the emitter wirings 90*a* and 90*c* extend in the X direction. Thus, a semiconductor chip and a semiconductor device that are highly reliable, can be provided.

The semiconductor chip 100 according to the embodiment includes the first insulating film 30*b* that is provided apart from the emitter wirings 90*a* and 90*c* and on the gate wiring 80*b*.

When the emitter wirings 90*a* and 90*c* become distorted in the X direction during pressure-welding in the vertical direction, they are likely to be mounted on the first insulating film 30*b*. Thus, the emitter wirings 90*a* and 90*c* are less likely to come into direct contact with the gate wiring 80*b*. This can provide a semiconductor chip and a semiconductor device that are further highly reliable.

The emitter wiring 90 is less likely to come into contact with the gate wiring (e.g., gate wiring 80*b* or gate wiring 80*e*), and thus the distance between the emitter wiring and the gate wiring can be decreased. Therefore, the active area of the semiconductor chip 100 can be increased.

By the semiconductor chip and semiconductor device according to the embodiment, a semiconductor chip and a semiconductor device that are highly reliable, can be provided.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor chip comprising:
a semiconductor substrate having an upper surface;
a plurality of first wirings extending in a first direction parallel to the upper surface of the semiconductor substrate and disposed entirely above the upper surface of the semiconductor substrate;
a second wiring disposed between two of the first wirings that are adjacent to each other such that an upper surface of the second wiring is below a lower surface of the two first wirings; and
a first insulating film provided on the second wiring and spaced apart from the two first wirings in a second direction that is perpendicular to the first direction and parallel to the upper surface of the semiconductor substrate, the first insulating film having an upper surface that is above the lower surface of the two first wirings; a first trench below one of the plurality of first wirings and a second trench below another one of the plurality of first wirings, the first and second trenches filled with polysilicon, wherein the polysilicon in the first trench and in the second trench are connected to each other via a polysilicon portion that is below the second wiring and is electrically connected to the second wiring.

2. The semiconductor chip according to claim 1, wherein none of the first wirings have an insulating film on either a side surface facing the first insulating film or an upper surface thereof that is located opposite to the semiconductor substrate.

3. The semiconductor chip according to claim 1, further comprising:
a third wiring disposed between one of the first wirings and a guard ring electrode disposed at a lateral edge of the semiconductor substrate such that an upper surface of the third wiring is below the lower surface of the one first wiring; and
a second insulating film provided on the third wiring and spaced apart from the one first wiring in the second direction, the second insulating film having an upper surface that is above the lower surface of the one first wiring.

4. The semiconductor chip according to claim 3, wherein the second wiring is electrically connected to the third wiring.

5. The semiconductor chip according to claim 4, further comprising:
a third insulating film provided below the first wirings and the second wiring.

6. The semiconductor chip according to claim 5, further comprising:

a fourth insulating film between the first insulating film and the second wiring and containing an insulating material different from that of the first insulating film.

7. The semiconductor chip according to claim 6, wherein each of the first wirings includes a first portion containing aluminum, a second portion above the first portion containing aluminum, and an oxide layer between the first portion and the second portion containing an oxide of aluminum.

8. The semiconductor chip according to claim 3, wherein the guard ring electrode is disposed entirely above the upper surface of the semiconductor substrate such that an upper surface of the third wiring is below the lower surface of the guard ring electrode.

9. The semiconductor chip according to claim 8, wherein the second insulating film extends out to the lateral edge of the semiconductor substrate to be above the guard ring electrode.

10. A semiconductor device comprising:

a first electrode;

a first buffer provided on the first electrode;

a plurality of semiconductor chips arranged on the first buffer;

a plurality of second buffers arranged respectively on the plurality of semiconductor chips; and a second electrode provided on the plurality of second buffers, wherein one of the semiconductor chips includes:

a semiconductor substrate having an upper surface;

a plurality of first wirings extending in a first direction parallel to the upper surface of the semiconductor substrate and disposed entirely above the upper surface of the semiconductor substrate;

a second wiring disposed between two of the first wirings that are adjacent to each other such that an upper surface of the second wiring is below a lower surface of the two first wirings; and a first insulating film provided on the second wiring and spaced apart from the two first wirings in a second direction that is perpendicular to the first direction, the first insulating film having an upper surface that is above the lower surface of the two first wirings.

11. The semiconductor device according to claim 10, wherein each of the other semiconductor chips includes:

a semiconductor substrate having an upper surface;

a plurality of first wirings extending in a first direction parallel to the upper surface of the semiconductor substrate and disposed entirely above the upper surface of the semiconductor substrate;

a second wiring disposed between two of the first wirings that are adjacent to each other such that an upper surface of the second wiring is below a lower surface of the two first wirings; and a first insulating film provided on the second wiring and spaced apart from the two first wirings in a second direction that is perpendicular to the first direction, the first insulating film having an upper surface that is above the lower surface of the two first wirings.

12. The semiconductor device according to claim 11, wherein the first wirings of the semiconductor chips are pressure-welded to the second buffers.

13. The semiconductor device according to claim 10, wherein none of the first wirings have an insulating film on a side surface or an upper surface thereof.

14. The semiconductor device according to claim 10, wherein the one semiconductor chip further includes:

a third wiring disposed between one of the first wirings and a lateral edge of the semiconductor substrate and entirely below the upper surface of the semiconductor substrate such that an upper surface of the third wiring is below the lower surface of the one first wiring; and a second insulating film provided on the third wiring and spaced apart from the one first wiring in the second direction, the second insulating film having an upper surface that is above the lower surface of the one first wiring.

15. The semiconductor device according to claim 14, wherein the second wiring is electrically connected to the third wiring.

16. The semiconductor device according to claim 15, wherein the one semiconductor chip further includes:

a third insulating film provided below the first wirings and the second wiring.

17. The semiconductor device according to claim 16, wherein the one semiconductor chip further includes:

a fourth insulating film between the first insulating film and the second wiring and containing an insulating material different from that of the first insulating film.

18. The semiconductor device according to claim 17, wherein each of the first wirings includes a first portion containing aluminum, a second portion above the first portion containing aluminum, and an oxide layer between the first portion and the second portion containing an oxide of aluminum.

19. The semiconductor device according to claim 10, wherein the one semiconductor chip further includes:

a first trench below one of the plurality of first wirings and a second trench below another one of the plurality of first wirings, the first and second trenches filled with polysilicon, wherein the polysilicon in the first trench and in the second trench are connected to each other via a polysilicon portion that is below the second wiring and is electrically connected to the second wiring.

\* \* \* \* \*